United States Patent

Dove et al.

[11] Patent Number: 5,939,225
[45] Date of Patent: *Aug. 17, 1999

[54] THIN FILM MATERIALS FOR THE PREPARATION OF ATTENUATING PHASE SHIFT MASKS

[75] Inventors: Derek Brian Dove, Mt. Kisco; Kwang Kuo Shih, Goldens Bridge, both of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/693,815

[22] Filed: Jul. 15, 1996

Related U.S. Application Data

[63] Continuation of application No. 08/200,117, Feb. 22, 1994, abandoned.

[51] Int. Cl.$^6$ ........................................ G03F 9/00
[52] U.S. Cl. .................................................. 430/5
[58] Field of Search ........................................ 430/5

[56] References Cited

U.S. PATENT DOCUMENTS

| | | | |
|---|---|---|---|
| 4,539,068 | 9/1985 | Takagi et al. | 427/570 |
| 4,923,772 | 5/1990 | Kirch et al. | 430/5 |
| 4,985,319 | 1/1991 | Watakabe et al. | 430/5 |
| 5,014,646 | 5/1991 | Ito et al. | 118/725 |
| 5,079,113 | 1/1992 | Ohta et al. | 430/5 |
| 5,087,535 | 2/1992 | Hirokane et al. | 430/5 |
| 5,174,826 | 12/1992 | Mannava et al. | 118/719 |
| 5,194,344 | 3/1993 | Cathey, Jr. et al. | 430/5 |
| 5,194,345 | 3/1993 | Rolfson | 430/5 |
| 5,194,346 | 3/1993 | Rolfson et al. | 430/5 |
| 5,196,101 | 3/1993 | Thakoor | 204/192.26 |
| 5,208,125 | 5/1993 | Lowrey et al. | 430/5 |
| 5,230,971 | 7/1993 | Hakki | 430/5 |
| 5,286,518 | 2/1994 | Lee | 430/5 |
| 5,419,988 | 5/1995 | Mohri et al. | 430/5 |
| 5,429,896 | 7/1995 | Hasegawa et al. | 430/5 |
| 5,429,897 | 7/1995 | Yoshioka et al. | 430/5 |
| 5,604,060 | 2/1997 | Miyashita et al. | 430/5 |
| 5,629,114 | 5/1997 | Isao et al. | 430/5 |

FOREIGN PATENT DOCUMENTS

| | | |
|---|---|---|
| 4339481 | 6/1995 | Germany. |
| 94/11786 | 8/1994 | WIPO .............................. G03F 1/14 |

OTHER PUBLICATIONS

Burn J. Lin, "The Attenuating Phase-Shifting Mask"—Solid State Technology—Jan. 1992 pp. 43–47.

IBM—Technical Disclosure Bulletin, vol. 35, No. 3, Aug. 1992 NY, USA, pp. 440–441, Anonymous 'Si–N Attenuated Phase Shift Layer for Phase Shift Mask Application'.

Journal of Vac. Sic. & Techn. Bulletin, vol. 12, No. 1, Feb. 1994 pp. 32–36, XP 000429019 K.K. Shih et al., 'Thin Film Materials for the Preparation of Attenuating Phase Masks'.

*Primary Examiner*—Bernard Codd
*Attorney, Agent, or Firm*—Daniel P. Morris; Anne Vachon Dougherty

[57] ABSTRACT

The fabrication of transmissive attenuating types of phase shift masks by formation of and selective etch of a layer, deposited on a substrate. This single layer provides both the phase shift and the attenuation required and is readily patterned and processed to produce attenuating phase shift masks. Materials suitable for the phase shift layer include, but are not limited to, a layer comprising silicon, nitrogen and carbon; and, a layer comprising silicon, oxygen and molybdenum.

10 Claims, 11 Drawing Sheets

THIN FILM MATERIALS FOR THE PREPARATION OF ATTENUATING PHASE SHIFT MASKS

This is a continuation of parent application Ser. No. 08/200,117, filed Feb. 22, 1994, now abandoned.

TECHNICAL FIELD

This invention relates to phase shift lithographic masks. More particularly, it relates to a mask and a process for making masks having attenuating layers.

BACKGROUND ART

There is considerable interest in phase shift masks as a route to extending the resolution, contrast and depth of focus of lithographic tools beyond what is achievable with the normal chrome mask technology. In the phase shift mask the quartz substrate plate is etched or coated so as to allow interference effects to be employed. The etch or coating has a thickness so that an optical path difference may be established between adjoining regions of just ½ wavelength, resulting in destructive interference at the boundary of the two regions. There has been a great deal of work to quantify and exploit these effects for example in alternating phase, rims and other structures. A problem that has so far hindered the introduction of phase shift masks into full scale microcircuit designs has been the difficulty of generating design tools to facilitate mask layout automatically for the circuit designer. For this reason there is a focus on the use of so called attenuating phase shift masks.

In the attenuating phase shift mask, the chrome layer is replaced by a slightly transparent layer in combination with a ½ wavelength phase shift. This mask has the properties that there is only one patterning step as for the chrome mask and that every edge has enhanced contrast due to the 180 degree phase shift effect. At present such masks are typically prepared by a combination of a slightly transparent, for example very thin chrome layer, coupled with a quartz etch to produced the desired phase shift. This method requires a high degree of control of both layer and etch process.

SUMMARY OF THE INVENTION

It is a principal object of the invention to provide a method for producing phase shift masks with attenuating layers.

It is another object of the invention to provide phase shift masks with layers wherein the attenuation is well controlled.

It is a further object of the invention to provide a mask wherein the desired phase shift and phase shift attenuation occur in the same layer.

The invention is directed to the fabrication of attenuating type of phase shift masks by selective etch of a layer, predeposited on a quartz substrate. This layer has the feature of combining both the phase shift and the attenuation required and is readily patterned and processed to produce attenuating phase shift masks. That is, the advantage of this method is that the light attenuation and phase shift are achieved with a single layer.

DESCRIPTION OF THE PREFERRED EMBODIMENTS

A key materials requirement is that the film thickness of the attenuating layer be chosen to correspond to an optical path length that produces a ½ wavelength shift relative to air i.e., $$(n-1)d = \lambda/2 \tag{1}$$

where n is the refractive index of the film at the lithographic tool exposure wavelength $\lambda$. In addition the film must possess very low intrinsic stress and must be capable of patterning by a process that etches the film but does not etch the substrate. The optical transmission of a film of this thickness corresponds to a chosen value typically 5 to 15% transmission. The optical transmission T can be expressed as $$T = (1-R)\exp(-4\pi kd/\lambda) \tag{2}$$

where k is the absorption coefficient, and R is the reflection which can also expressed as $$R = \{(n-1)^2 + k^2\}/\{(n+1)^2 + k^2\}. \tag{3}$$

These three equations relate the desired phase shift mask properties of 180 degree phase shift, transmission T and maximum allowed reflectivity R, to the material parameters of refractive index, absorption and film thickness n, k and d. Evidently n and k may not be chosen independently since from equations (1)–(3), $$k = (n-1)(1/2\pi)\ln\{(1-R)/T\}. \tag{4}$$

Figure 1:
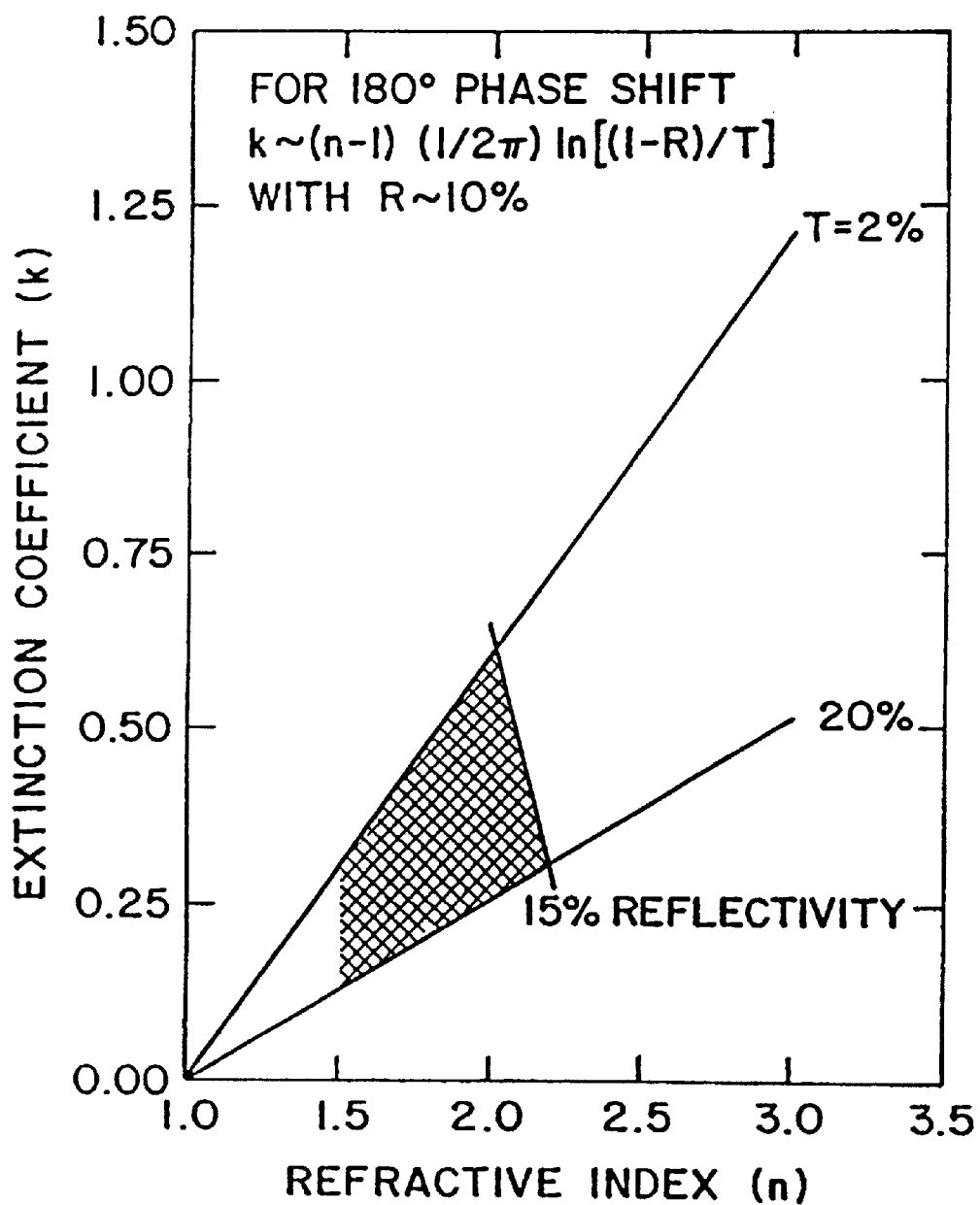
FIG. 1 is a graphical representation of the region of the interest for attenuating phase shift layers.

The requirements on the optical properties are summarized in FIG. 1, where the cross hatched region shows the range of values of n and k for the extreme values of transmission of 2 and 20%. Too high a value of refractive index gives rise to the surface reflectivity of the film becoming greater than 10%. The approach herein is directed to methods for controlling the value of k with minimal perturbation of the value n.

In order to achieve the combination of optical properties desired several materials systems are studied. The first of these, exemplified by Si—N, may be selectively etched to some degree relative to the quartz substrate. The second system exemplified by $SiO_2$ requires an etch stop layer. The approach taken is to select an ultraviolet transmitting material and deposit it so as to contain a suitable amount of a similar nitride or oxide that is known to possess relatively strong ultraviolet absorption. Films were deposited by an rf sputtering technique in a reactive atmosphere containing either nitrogen or oxygen. By incorporating some fraction of constituents such as excess Si, Mo, Cr, Co, Ni or Fe into the sputtering targets, films of either nitrides or oxides can be prepared having a controlled degree of optical transmission at the wavelengths of interest, 365 nm and 248 nm.

Figure 2:
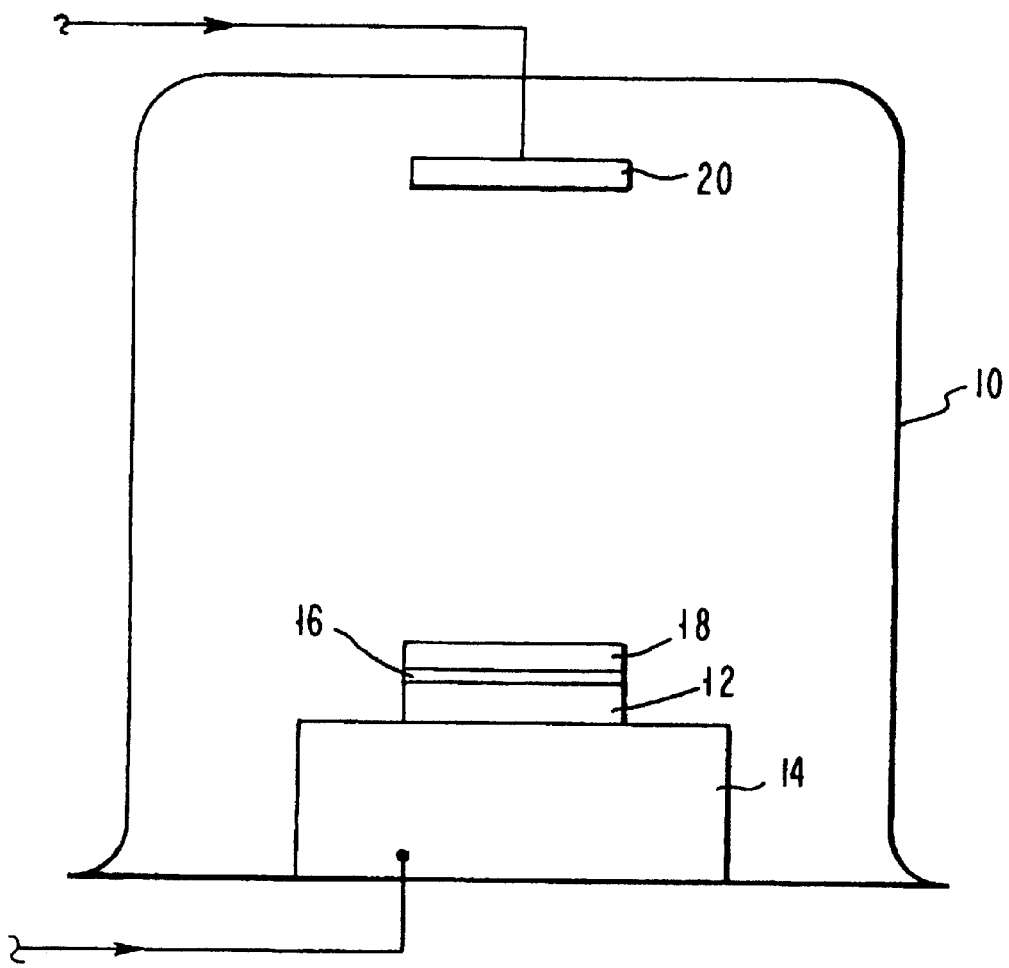
FIG. 2 is a schematic cross sectional representation of an apparatus for depositing layers in accordance with the invention.

Referring to FIG. 2, films were deposited by an rf diode sputtering system. The sputtering chamber 10 may be evacuated to less than $10^{-7}$ Torr by a turbomolecular pump prior to the introduction of the gas mixture. A quartz plate, such as a plate 12, is used as a substrate. Plate 12 is mounted on a water cooled 8 inch diameter fixture 14. If necessary or if desired, plate 12 may have deposited thereon an etch stop layer 16 as more fully described below, by methods well known in the art. In accordance with the invention an attenuating phase shift layer 18 is sputtered directly on to plate 12 or on to etch stop layer 16, if an etch stop layer is used. During the deposition, input power of 200 W is applied between sputtering target 20 and fixture 14, in a manner well known in the art. A total pressure of 5 mTorr is used. After deposition, the thickness of layer 18 is determined by a Tencor Alpha-step Profilometer (not shown). X-ray diffraction using an automated diffractometer is used to study the structure of some of these layers or films. Optical transmission is measured using a Varian DMS-200 UV visible spectrophotometer (not shown).

Figure 3:
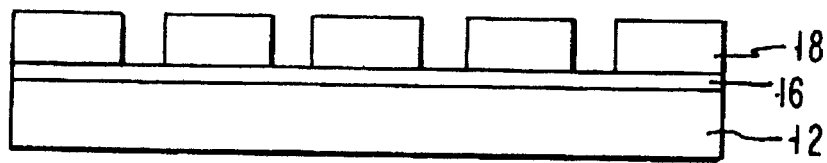
FIG. 3 is a schematic cross sectional representation of a patterned lithographic phase shift mask in accordance with the invention.

The layer 18 of the phase shift mask blank produced using the technique as illustrated in FIG. 2 is then patterned to produce a desired lithographic mask, as is represented in FIG. 3. An advantage to using a silicon based layer is that, this may be done by techniques such as reactive ion etching (RIE) or wet etching, as is well known in the art. Etch stop layer 16 may or may not be present, depending upon what type of etching is used. The type of etch in turn depends upon the material which forms layer 18. Examples are set forth below.

Figure 4:
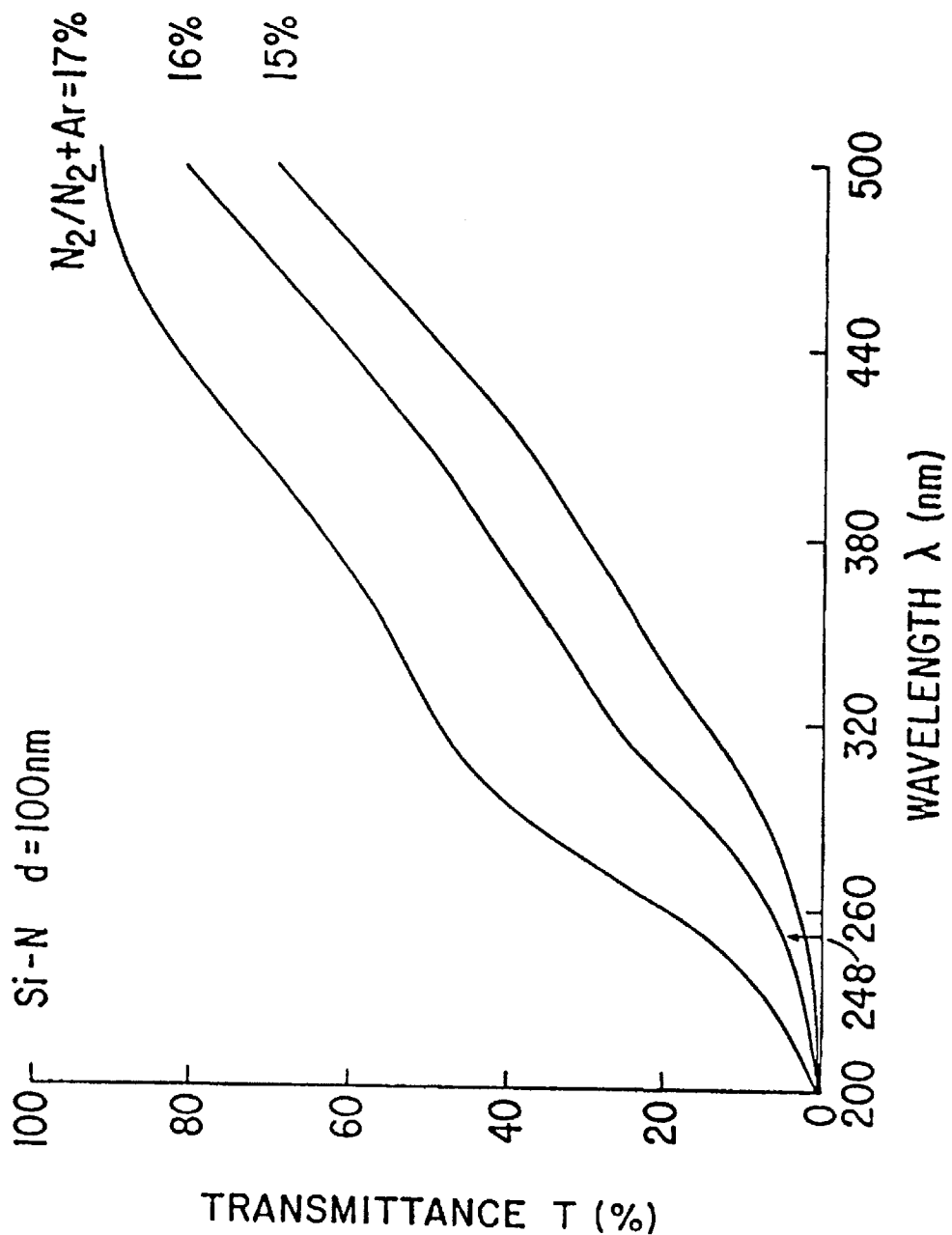
FIG. 4 is a graphical representation of the transmittance of Si—N films as a function of wavelength for films with a thickness of 100 nm deposited at different nitrogen pressures.
Figure 5:
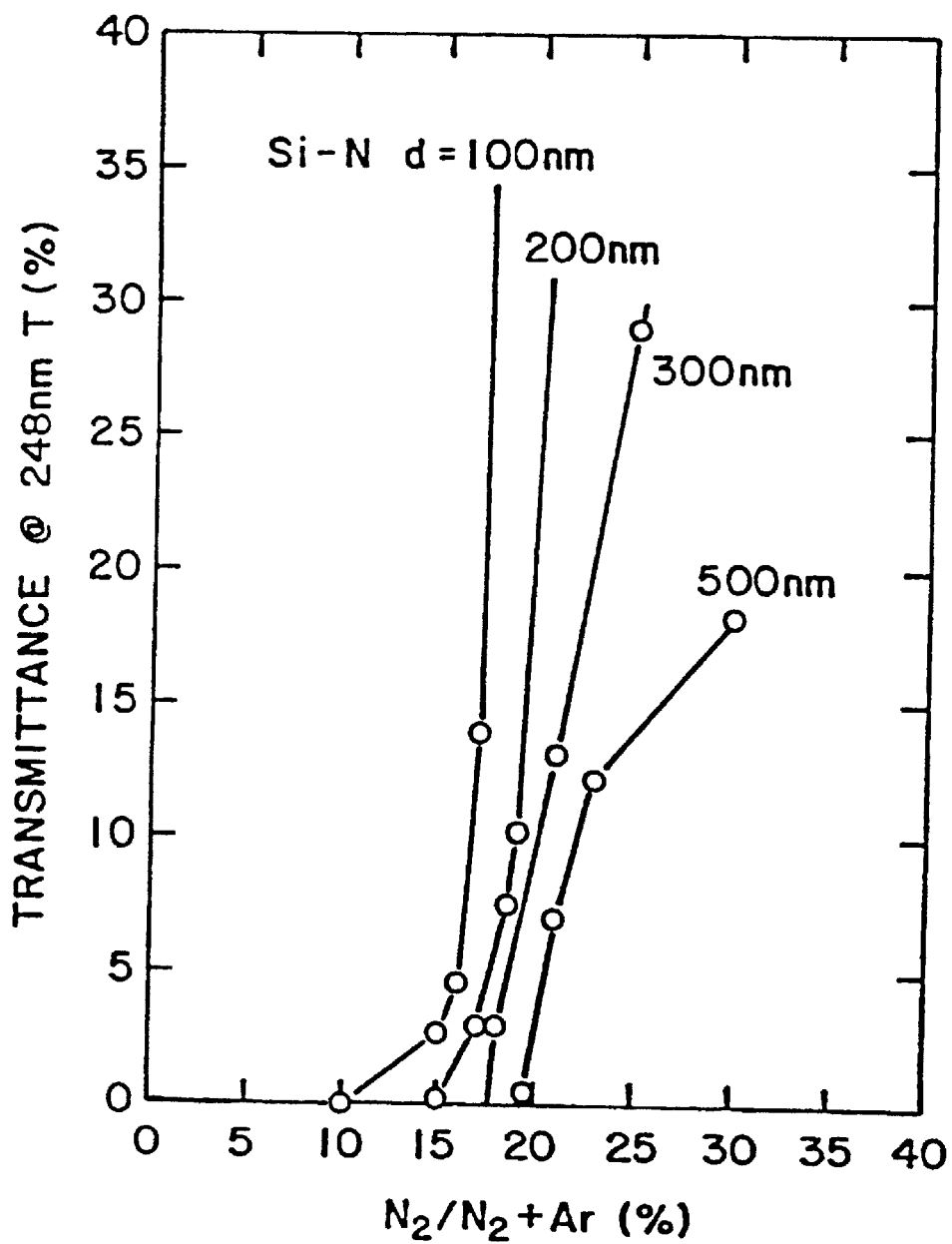
FIG. 5 is a graph of transmittance of Si—N films at 248 nm as a function of nitrogen pressure with different thicknesses.

Silicon nitride based layers are attractive for use as attenuating type phase shift masks since they may be patterned by etch process that etch the substrate relatively slowly. The Si—N films were deposited by rf sputtering using a silicon target and a sputtering gas mixture consisting of argon and nitrogen. During sputtering, the nitrogen fraction is varied from 0 to 30%. At high nitrogen levels transparent films of silicon nitride are obtained. As the proportion of nitrogen is decreased, the films become silicon rich and optical absorption is introduced into the film. The magnitude of this absorption can be controlled by the ratio of nitrogen to argon in the sputtering gas. The transmittance of various Si—N films at a constant thickness of 100 nm but deposited at different nitrogen pressure is shown in FIG. 4. Similar results are obtained for different film thicknesses. From the data of FIG. 4 for 100 nm thick films and from data from other thicknesses, the transmittance of Si—N films at 248 nm are plotted in FIG. 5. An empirical fit relating absorption constant α and nitrogen percentage P is given by $\alpha = 0.06/(P-13.3)$. The optical transmission T for the film can be expressed $$T = (1-R)\exp\frac{-0.06d}{P-13.3} \quad (5)$$

where d is the thickness of the film in nm and R is the reflectivity.

If n=2.3 and λ=248 nm, the thickness required for a phase shift according to equation (1) is therefore 95 nm. To achieve a light transmission of 5 to 10%, from equation (5) 15.9% nitrogen is required. Although a useful range of optical transmission may be obtained for films satisfying the 180 degree phase shift requirement, the control requirement on nitrogen fraction is exceedingly stringent as we can see in FIG. 5. Although this method is usable, it is not favorable for the routine production of attenuating type of phase shift masks.

When a SiC target is sputtered in argon gas, the films were fairly absorbing at 248 nm. The addition of oxygen in the sputtering gas increases the transparency of the sputtered films. However, the control of oxygen pressure is very critical. A 1% change of oxygen pressure can change the optical transmission by an order of magnitude.

Figure 6:
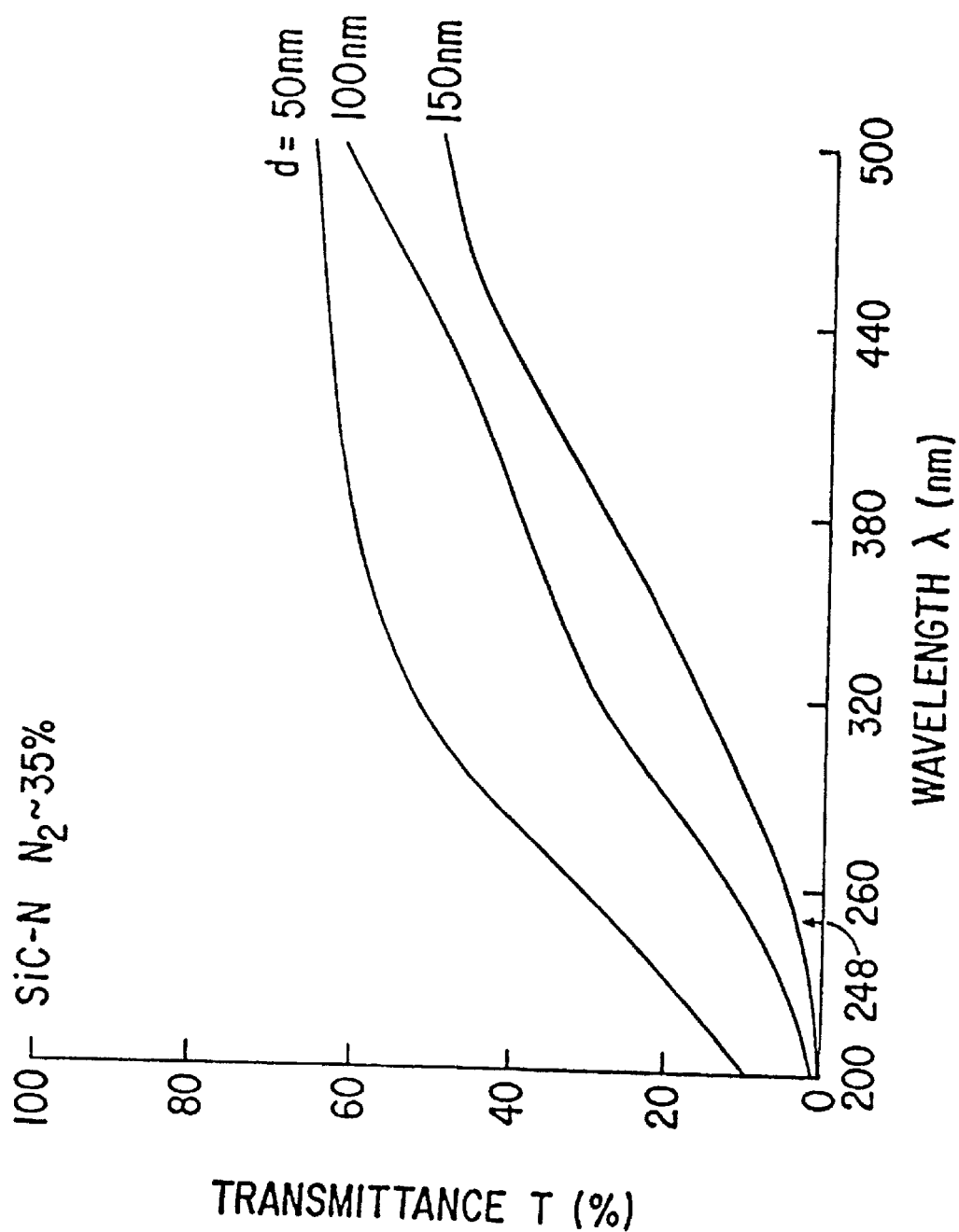
FIG. 6 is a graph of transmittance of SiC—N films as a function of wavelength deposited at 35% nitrogen content for different thicknesses.
Figure 7:
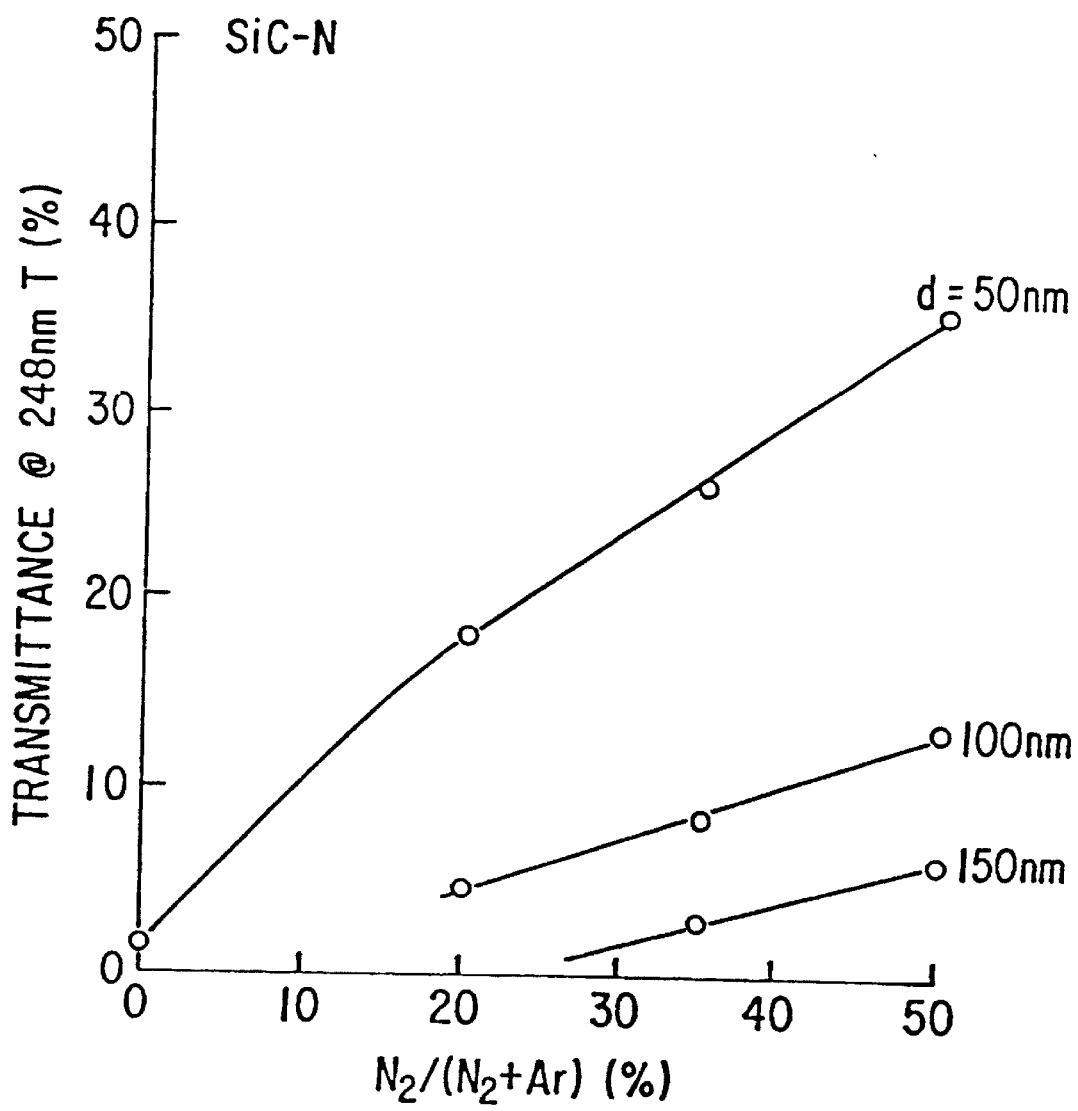
FIG. 7 is a graph of transmittance of SiC—N films at 248 nm as a function of nitrogen pressure during deposition at different thicknesses.

The addition of nitrogen gas during the sputtering also reduces the absorption of the sputtered films. But the change of transmittance with nitrogen pressure is very gradual so that the control of nitrogen pressure is not critical. The transmittance of SiC—N films at 35% nitrogen content in an argon-nitrogen gas mixture during sputtering with different film thicknesses as is shown in FIG. 6. From FIG. 6, and from the data obtained at other nitrogen pressures, the transmittance of SiC—N films at 248 nm as a function of nitrogen pressure is plotted in FIG. 7. For films with a thickness of about 100 nm as required for the desired phase shift, transmittance between 5 to 15% can be easily obtained without critical control of $N_2$ pressure. This system therefore offers promise as a single layer attenuating type phase shift mask material.

Oxide base films may also be used for the preparation of attenuating type phase shift masks but in this case an etch stop layer must be used. Several materials including $Al_2O_3$ and $HfO_2$ have been found to be satisfactory for this purpose.

Figure 8:
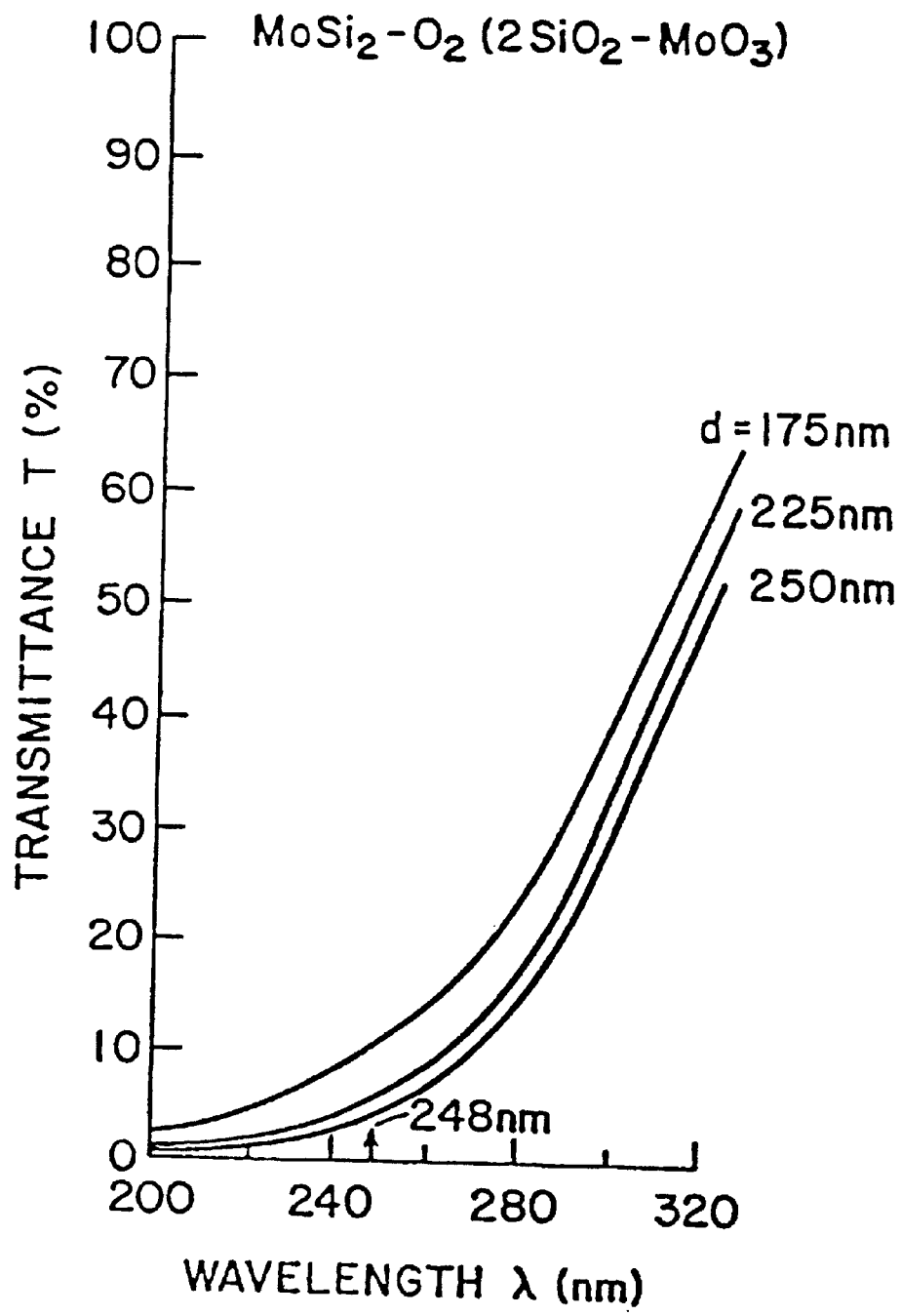
FIG. 8 is a graph of transmittance of $MoSi_2$—$O_2$ films as a function of wavelength at different thicknesses.
Figure 9:
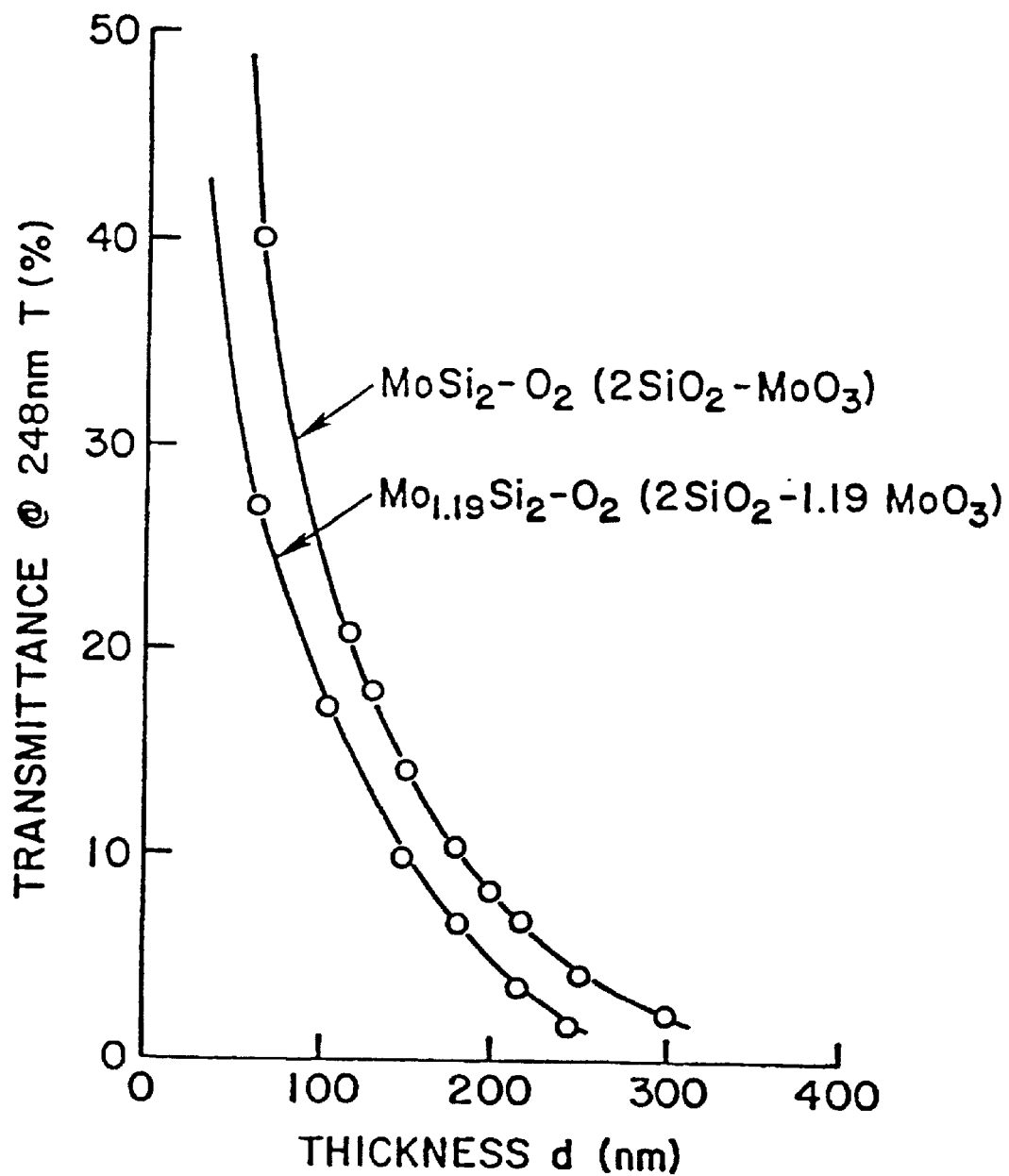
FIG. 9 is a graph of transmittance of $MoSi_2$—$O_2$ and $Mo_{1.19}Si_2$—$O_2$ films at 248 nm as a function of film thickness.

$MoSi_2$—$O_2$ is obtained by reactive sputtering of a $MoSi_2$ target in the presence of a mixture of oxygen and argon gas. During sputtering, the oxygen content varied between 0 and 40%. It is found that if the oxygen content is greater than 8% during sputtering, the films obtained had almost the same optical transmission. The transmittance for these films of different thickness is shown in FIG. 8. The transmittance at 248 nm as a function of film thickness d for $MoSi_2$ films deposited with oxygen content during sputtering greater than 8% is shown in FIG. 9. If some nitrogen is added, there is only a slight increase in absorption. The absorption coefficient α calculated from FIG. 9 using the relationship exp-αd is approximately $1.2 \times 10^{-3}$. Films with a thickness of approximately 180 nm which have 10% optical transmission are deposited on 5" and 6" square fused quartz substrates with a $HfO_2$ etch stop layer for making phase shift masks. The phase shift is measured to be approximately 180 degrees and the refractive index is estimated to be about 1.68 at 248 nm from a direct interferometric measurement of phase shift.

When these films are analyzed by the microprobe, it is determined that they have a composition corresponding to 2-$SiO_2$ and $MoO_3$. The refractive index of these films is approximately 1.6 at 623.8 nm.

A Mo target is also reactive sputtered in an oxygen-argon gas mixture to prepare Mo—$O_2$ films with different thicknesses. These films are also analyzed by the microprobe and it is determined that their composition is $MoO_3$. Hence, it is concluded that both Si and Mo components in the target completely oxidized during the reactive sputtering process. If the composition of Mo is changed in the target, the transmission of the sputtered films can be varied.

Figure 10:
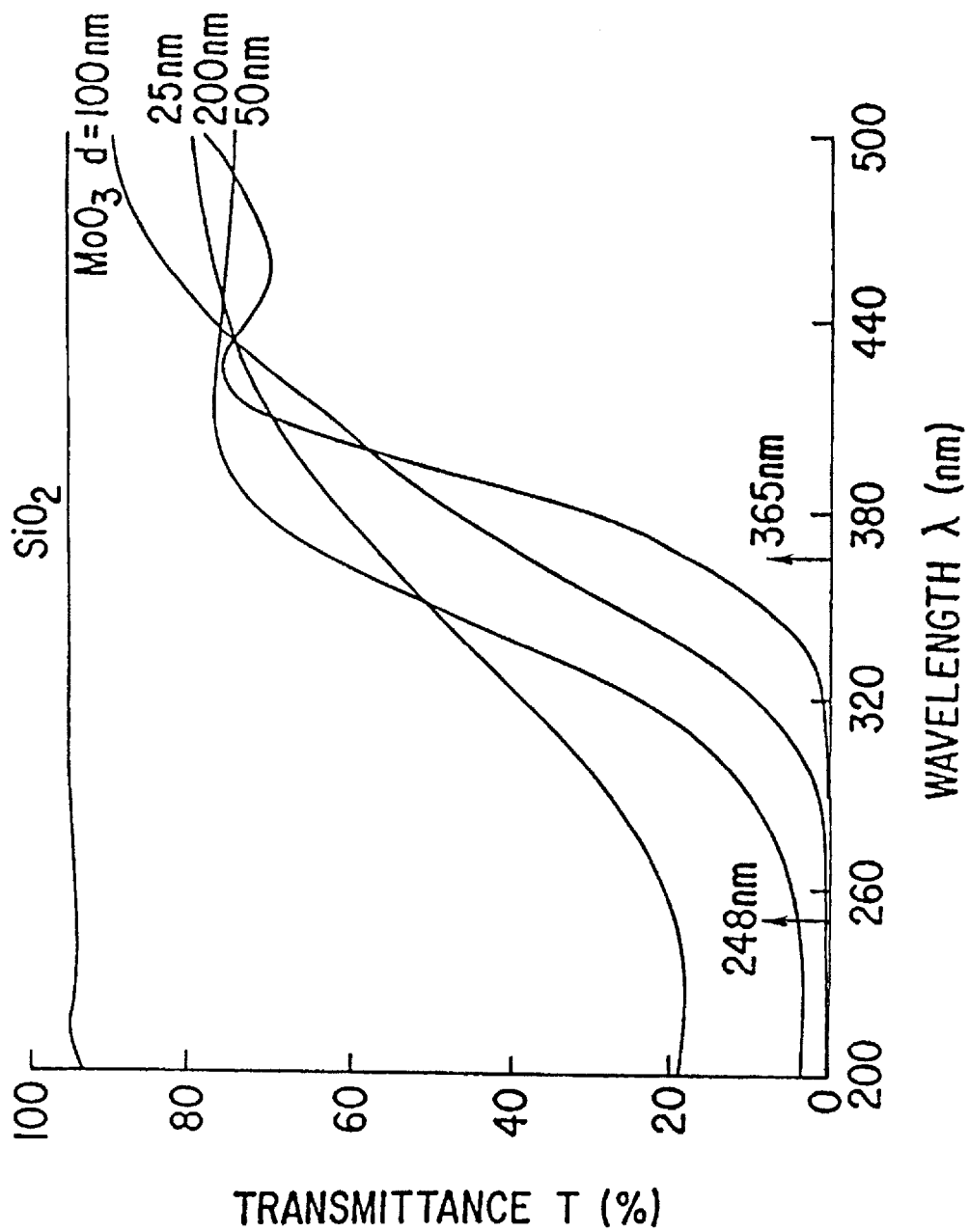
FIG. 10 is a graph of transmittance of $SiO_2$ and $MoO_3$ films as a function of wavelength.

The transmittance of $SiO_2$ films and $MoO_3$ films with different thickness was measured and plotted on FIG. 10. The transmittance of $SiO_2$ is very high at 248 nm (above 90%), while the transmittance of $MoO_3$ is very low at 248 nm depending on the thickness of the $MoO_3$ layer. From this figure, it is estimated that for films with a thickness of about 180 nm, in order to have only 6% optical transmittance at 248 nm, the target material should have a composition of $Mo_{1.19}Si_2$. To test this assumption, a new target with this composition was obtained and films deposited. The results was also plotted in FIG. 9. The transmittance at 248 nm for a film approximately 180 nm thick was reduced to 6% as predicted.

The use of a Si target reactively sputtered with nitrogen gas to obtain Si—N films results in attenuation which is difficult to control, while the use of a Si—C target to obtain SiC—N films produces more controlled attenuation. The Mo—Si system provides much more flexibility. The optical transmission can be tailored to any value at any thickness by varying the Mo concentration in the target material, and the process is very easy to control because of the wide range of oxygen pressure which can be used. It is evident that other metals such as Cr, W, Ti, etc. may also be used.

Figure 11:
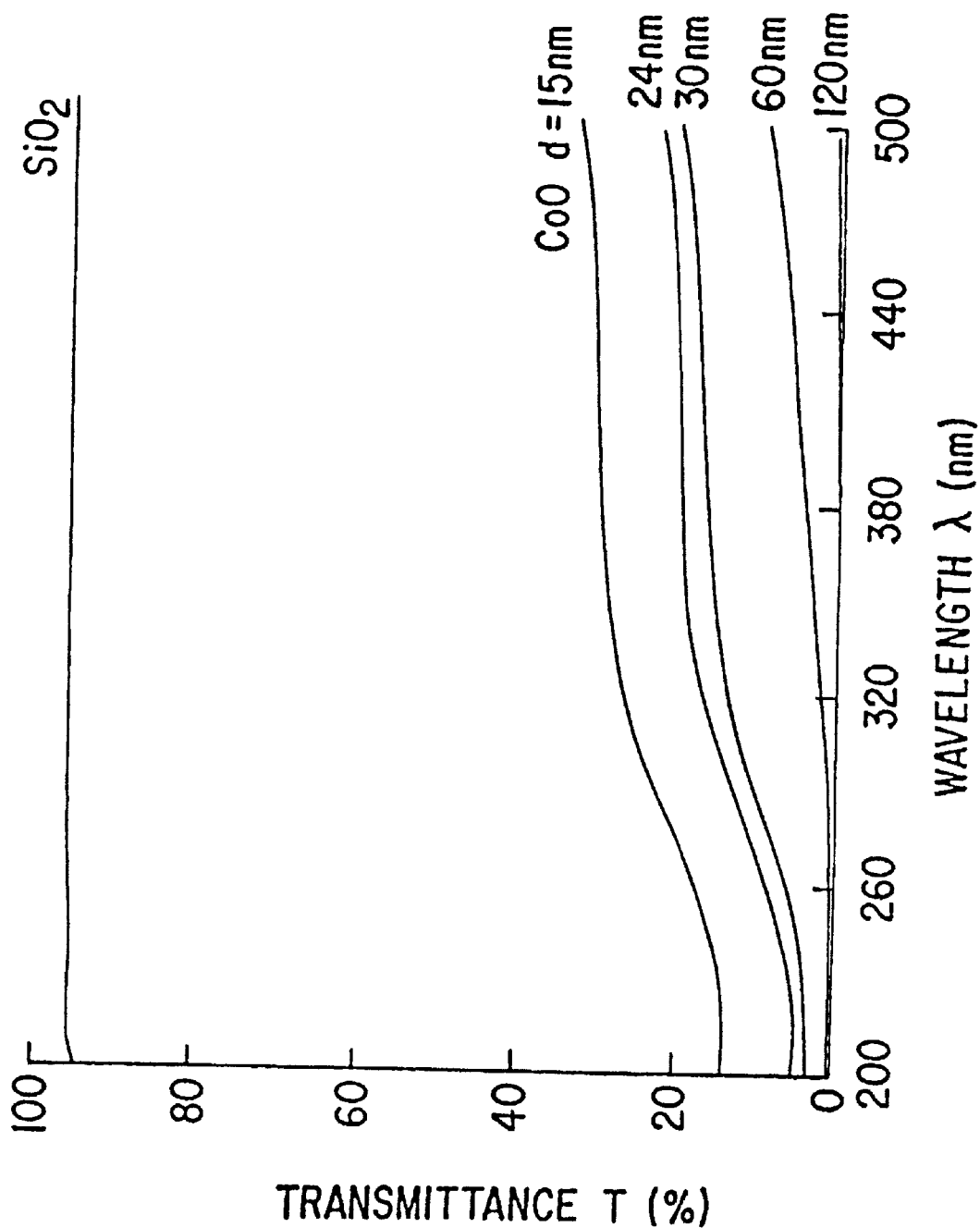
FIG. 11 is a graph of transmittance of $SiO_2$ and $CoO$ films as a function of wavelength.

Because of the high transmittance at 365 nm for the Mo—Si system as shown in FIG. 10, only masks for 248 nm can be made. There are many oxides which do have high absorption at 365 nm such as CoO, NiO, $Fe_2O_3$, etc. FIG. 11 shows the transmittance of $SiO_2$ and CoO films of different thicknesses.

It may be concluded that $SiO_2$ cosputtered with CoO is a good candidate for making both 248 nm and 365 nm attenuated phase shift layers.

Figure 12:
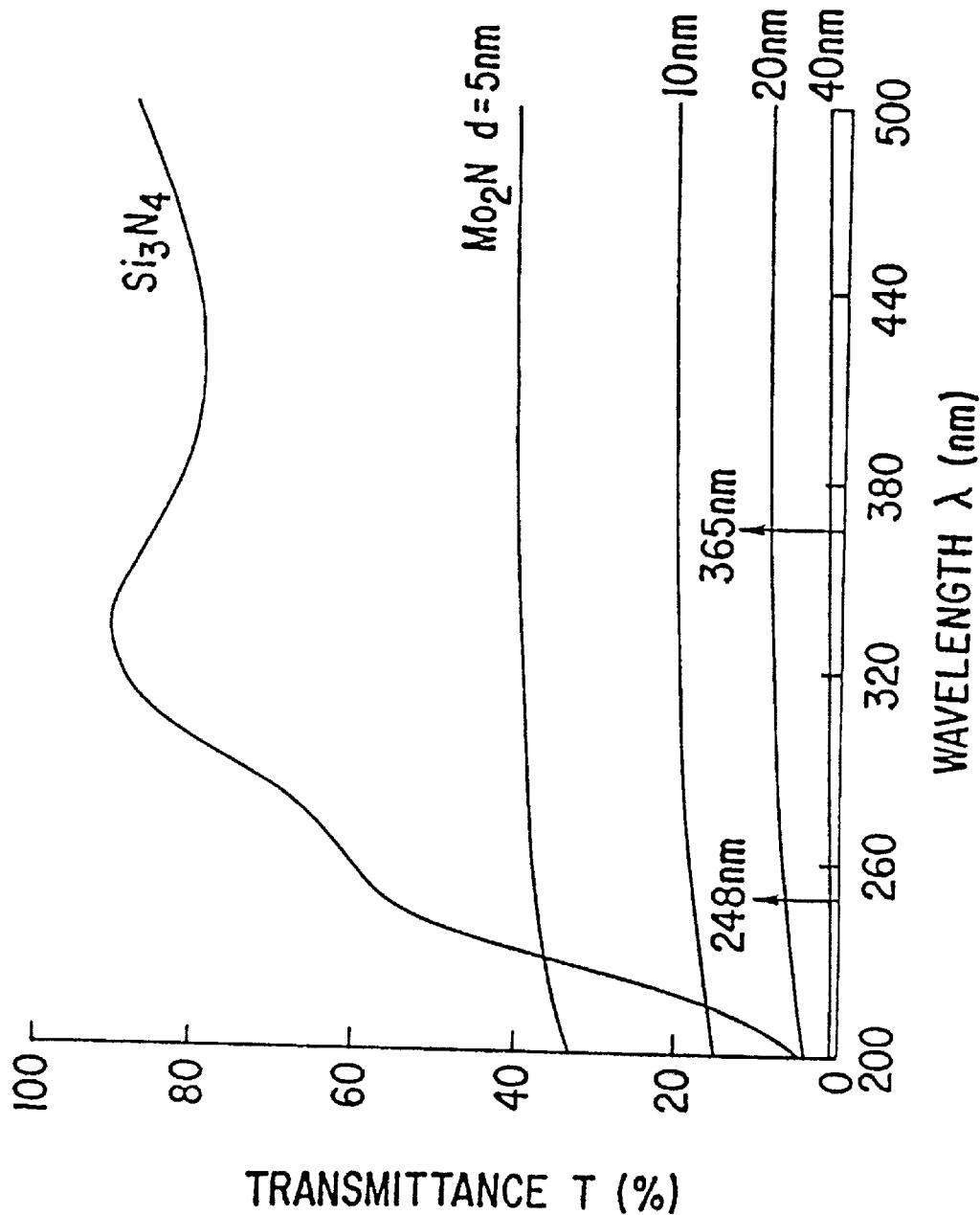
FIG. 12 is a graph of transmittance of $Si_3N_4$ and $Mo_2N$ films as a function of wavelength.

The attenuated phase shift layers based upon $SiO_2$ may need an etch stop layer against the RIE etching used to pattern the edges, since the $SiO_2$ etch process also attacks the quartz substrate. Hence it may be of advantage if the attenuated phase shift layers contain basically $Si_3N_4$ so that no etch stop layer is needed. This can be easily done by using a sputtering target such as Mo—Si in a nitrogen-argon gas mixture. The transmittance of $Si_3N_4$ and $Mo_2N$ films with different thicknesses is shown in FIG. 12. Because the optical absorption of $Mo_2N$ films is higher than $MoO_3$ films at the same thickness, less Mo is needed in the Mo—Si target. In addition, other metals such as Cr, W, Ti, Hf, Zr, Co, Ni, Fe, etc. can also be used to make the attenuated phase shift films.

In summary, a number of material systems have been identified as having promise for the preparation of attenuating type phase shift layers. In general the nitride based systems offer the possibility of being etched selectively against the quartz substrate. Much higher etch selectivity may be achieved by use a transparent etch stop layer such as $Al_2O_3$ and $HfO_2$. In this case the light attenuating layer may comprise $SiO_2$ or other ultraviolet transparent material cosputtered with a range of other materials such as Co, Mo, Ni, Cr, Ti, etc. It is found that to a first approximation the amount of absorbing metal required may be estimated from the measured absorption of the corresponding oxide.

While the invention has been particularly shown and described with respect to preferred embodiments thereof, it will be understood by those skilled in the art that changes in form and details may be made therein without departing from the scope and spirit of the invention.

We claim:

1. A phase shift mask comprising;
   a substrate which is transmissive at a given wavelength; and
   a deposited phase shift layer comprising silicon, nitrogen and a species which is absorbant at said wavelength.

2. The phase shift mask of claim 1 wherein said species is carbon.

3. The phase shift mask of claim 1 wherein said species includes a metal ion.

4. A phase shift mask comprising;
   a substrate which is transmissive at a given wavelength; and
   a deposited phase shift layer comprising silicon, oxygen and a species which is absorbant at said wavelength.

5. The phase shift mask of claim 4 wherein said species includes a metal ion.

6. The phase shift mask of claim 4 wherein said species includes $MoO_3$.

7. A lithographic mask for use with energy of a given wavelength, said mask comprising:
   a substrate that is transmissive for energy at said wavelength;
   a layer on said substrate that provides both a phase shift and an attenuation of energy of said wavelength, said layer comprising:
      a matrix which is essentially transparent to energy of said wavelength;
      a controlled amount of a species which absorbs energy at said wavelength distributed in said matrix.

8. The mask of claim 7 wherein said matrix contains silicon.

9. The mask of claim 7 wherein said species includes a metal ion.

10. The mask of claim 7 wherein said matrix includes silicon dioxide and said absorbing species is $MoO_3$.

* * * * *